United States Patent [19]

Sasaki

[11] Patent Number: 6,147,537
[45] Date of Patent: Nov. 14, 2000

[54] RESET CIRCUIT FOR FLIPFLOP

[75] Inventor: Kou Sasaki, Tokyo, Japan

[73] Assignee: NEC Corporation, Tokyo, Japan

[21] Appl. No.: 09/189,146

[22] Filed: Nov. 10, 1998

[30] Foreign Application Priority Data

Nov. 10, 1997 [JP] Japan .................................. 9-307263

[51] Int. Cl.$^7$ ...................................................... H03K 3/00
[52] U.S. Cl. .......................... 327/298; 327/143; 327/544
[58] Field of Search ................................. 327/142, 143, 327/198, 291, 208, 298, 544

[56] References Cited

U.S. PATENT DOCUMENTS 5,469,099  11/1995  Konishi ................................... 327/198
5,604,713   2/1997  Short et al. ......................... 365/230.06

Primary Examiner—Margaret R. Wambach
Assistant Examiner—Cassandra Cox
Attorney, Agent, or Firm—Foley & Lardner

[57] ABSTRACT

In order to prevent the value of a flipflop from being indefinite during a period from a power-on time to the time a first clock signal is inputted, a reset circuit for a flipflop is configured to supply a clock to a clock input terminal of each of flipflops at the power-on time, so that an output of each flipflop never becomes indefinite. For example, in the case that an input/output of tristate buffers coinected in common to the same bus are controlled by a corresponding number of flipflops, respectively, a pass-through current caused for an output collision on the bus can be prevented with a relatively small scale of circuit.

12 Claims, 4 Drawing Sheets

RESET CIRCUIT FOR FLIPFLOP

BACKGROUND OF THE INVENTION

1. Field of the Invention

The present invention relates to a reset circuit, and more specifically to a reset circuit for a flipflop.

2. Description of Related Art

In the prior art, this type of reset circuit has been used in a processor having a data bus, in order to prevent a pass-through current occurring due to a logic collision on a bus caused because the output value of bus controlling flipflops are indefinite at a power-on time.

Referring to FIG. 6, there is shown a block diagram of one example of the prior art reset circuit. In the shown prior art example shown in FIG. 6, a plurality of data path blocks 1, 2 and 3 are connected to the same bus 16, which is connected with a bus latch 32. These data path blocks are the same in a connection fashion with the bus and in an internal construction. Therefore, the data path block 3 will be described in detail.

In the data path block 3, a data path unit 6 has data output terminals connected to tristate buffers 14 and 15, respectively, and data input terminals connected to the data bus 16. The tristate buffers are of the same number as a bit width of the data bus 16. Here, it is assumed that the bit width of the data bus 16 is 2 for simplification of description and drawings. An output of the tristate buffers is connected to the data bus 16. A control terminal of the tristate buffers 14 and 15 is connected to an output of a flipflop circuit (abbreviated to "FF" in the drawings) 31. A data input terminal of the flipflop 31 is connected to one corresponding signal line of selection signal lines 17, and a clock terminal of the flipflop 31 is connected to a clock signal line 20. A reset terminal of the flipflop 31 is connected to a reset signal line 25. A control circuit 19 has output terminals of the number corresponding to the number of data path blocks connected to the bus. The output terminals of the control circuit 19 are connected to the selection signal lines 17, respectively. The reset signal line 25 is connected to an output of a power-on-reset circuit 23.

Now, an operation of the prior art reset circuit will be described. In the circuit shown in FIG. 6, when it is powered on, the content held in the flipflops associated to the respective units become indefinite. Therefore, assuming that the flipflops had no reset input, there is a possibility that for example, the output of the flipflop 30 becomes a high level, the output of the flipflop 31 becomes a high level, an output of a tristate buffer 13 becomes a high level, and the output of the tristate buffer 14 becomes a low level, with the result that a pass-through current flows through the bus. However, since the reset terminal of each flipflop is supplied with the power-on-reset signal, each flipflop is reset at the power-on time, so that the output of each flipflop becomes "0", with the result that the output of all the tristates buffers connected to the bus have a high impedance, and therefore, the bus is held at the value of the bus latch 32 Furthermore, if the external clock is inputted, the value of each flipflop becomes a value reflecting the corresponding output of the control circuit 19, so that the bus is driven with only one unit.

The above mentioned prior art reset circuit has a problem in which the flipflop having the reset function, of the number equal to the number of the units, are required, and in addition, it is necessary to lay out the reset signal line. This results in an increased circuit scale, and in an increased occupying area when the, circuit is incorporated in an LSI (large scale integrated circuit.

SUMMARY OF THE INVENTION

Accordingly, it is an object of the present invention to provide a reset circuit for a flipflop, which has overcome the above mentioned defect of the conventional one.

Another object of the present invention is to provide a reset circuit for a flipflop, capable of preventing the value of the flipflop from being indefinite during a period from a power-on time to the time a first clock signal is inputted.

The above and other objects of the present invention are achieved in accordance with the present invention by a reset circuit for a flipflop comprising:

a clock generating means for generating an internal clock different from an external clock which is supplied from an external to the flipflop to cause the flipflop to generate an output; and a clock supplying means for supplying the internal clock generated by the clock generating gleans, to a clock input terminal of the flipflop at a power-on time where the output of the flipflop becomes indefinite, thereby to prevent instability of the output of the flipflop at the power-on time.

For example, the clock generating means is a reset clock generating circuit for generating a reset clock at the power-on time, the reset clock being supplied to the clock input terminal of the flipflop by the clock supplying means.

In one embodiment, the clock supplying means includes a power-on-reset circuit for generating a power-on-reset signal having a predetermined active period of time at the power-on time, and a selector circuit for supplying the internal clock generated by the clock generating means, to the clock input terminal of the flipflop during a period of time in which the power-on-reset signal is active, the selector circuit supplying the external clock to the clock input terminal of the flipflop after the power-on-reset signal is rendered inactive.

In this embodiment, for example, the clock generating means can be constituted of a ring oscillator.

In another embodiment, the clock supplying means includes a power-on-reset circuit for generating a power-on-reset signal having a predetermined active period of time at the power-on time, and an OR gate receiving the power-on-reset signal and the external clock for supplying the power-on-reset signal to the clock input terminal of the flipflop during a period of time in which the power-on-reset signal is activated at a high level, and for supplying the external clock to the clock input terminal of the flipflop after the power-on-reset signal is deactivated to a low level.

In this embodiment, the clock generating means can be constituted of the power-on-reset circuit.

In addition, the flipflop is a flipflop having no reset input terminal.

As mentioned above, the reset circuit for the flipflop in accordance with the present invention comprises the clock generating means and the clock supplying means for supplying the clock to the clock input terminal of the flipflop at the power-on time. Therefore, since the clock input terminal of the flipflop is supplied with the clock at the power-on time, an output of the flipflop never becomes indefinite. For example, in the case that an input/output of tristate buffers connected in common to the same bus are controlled by a corresponding number of flipflops, respectively, a pass-through current caused for an output collision on the bus can be prevented with a relatively small scale of circuit.

The above and other objects, features and advantages of the present invention will be apparent from the following description of preferred embodiments of the invention with reference to the accompanying drawings.

DESCRIPTION OF THE PREFERRED EMBODIMENTS

Embodiments of the reset circuit in accordance with the present invention will be described with reference to the drawings.

Figure 1:
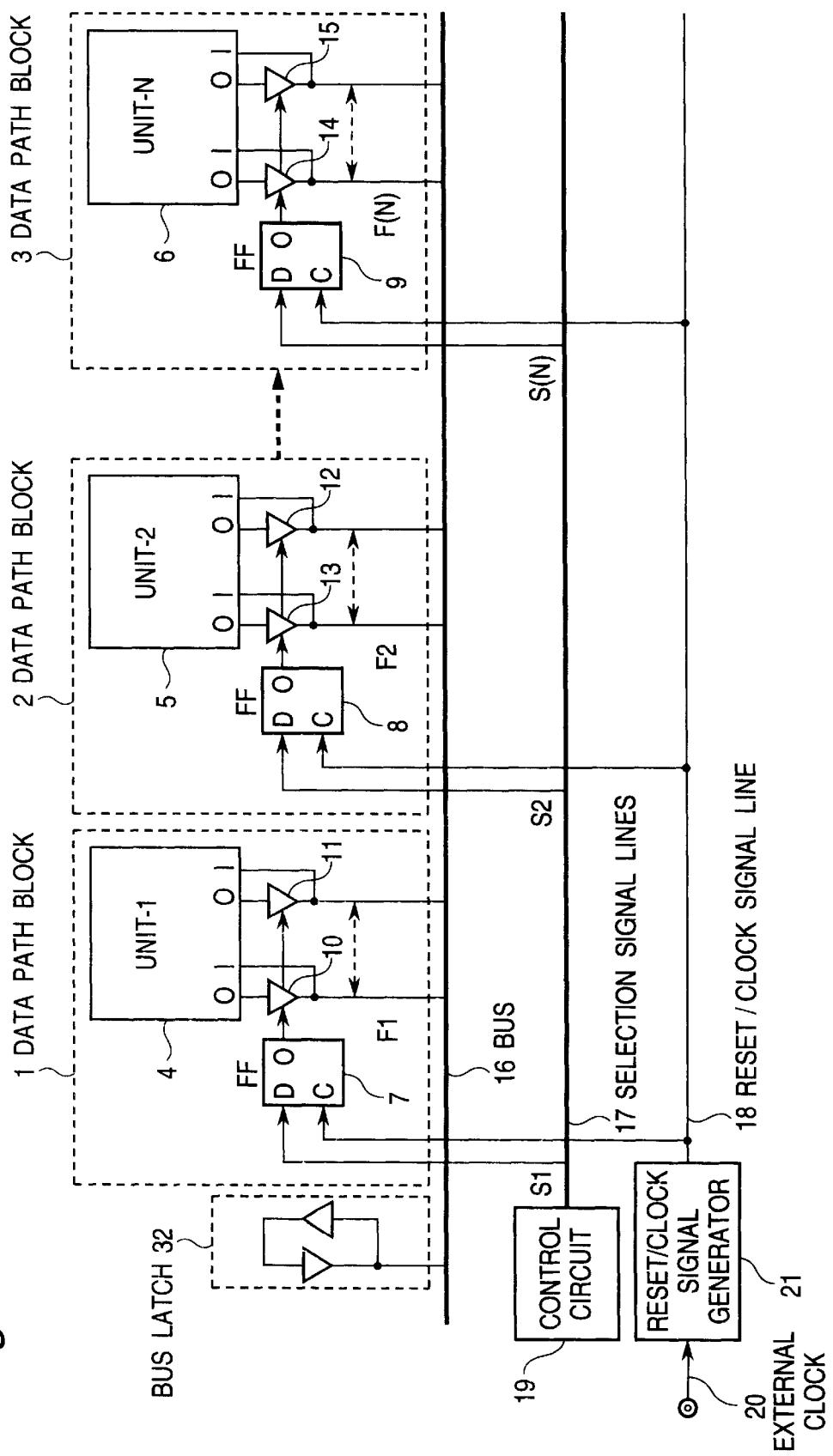
FIG. 1 is a block diagram of an embodiment of the reset circuit in accordance with the present invention.

Referring to FIG. 1, there is shown a block diagram of an embodiment of the reset circuit in accordance with the present invention. In FIG. 1, elements corresponding to those shown in FIG. 6 are given the same Reference Numerals, and explanation will be omitted.

Figure 6:
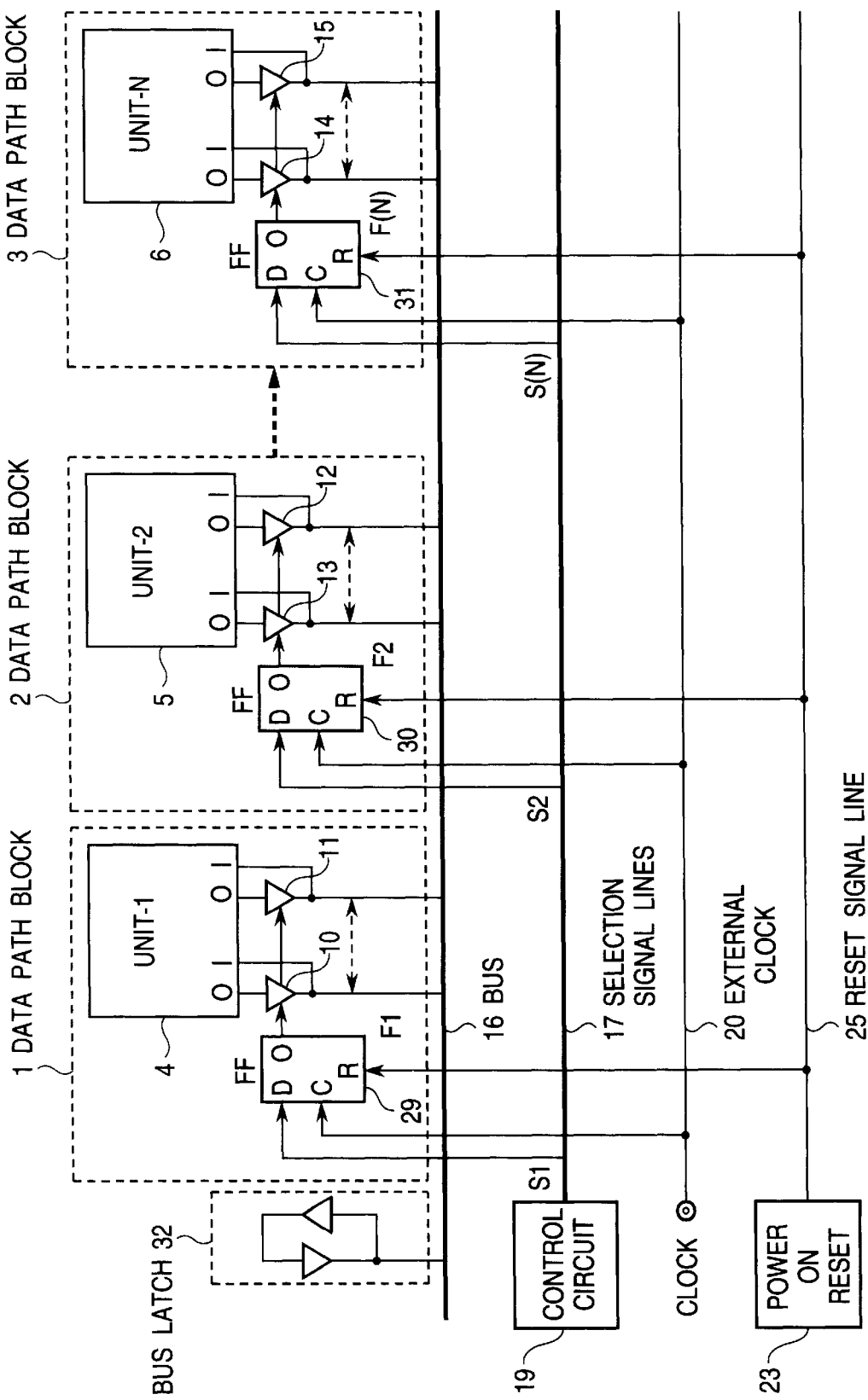
FIG. 6 is a block diagram of one example of the prior art reset circuit.

As seen from comparison between FIG. 1 and FIG. 6, flipflops 7 to 9 having no reset input terminal are provided in place of the flipflops 29 to 31, and therefore, the reset signal line 25 is omitted. A clock input terminal of the flipflops 7 to 9 is connected to a reset/clock signal line 18 connected to an output of a reset/clock signal generator 21.

Figure 2:
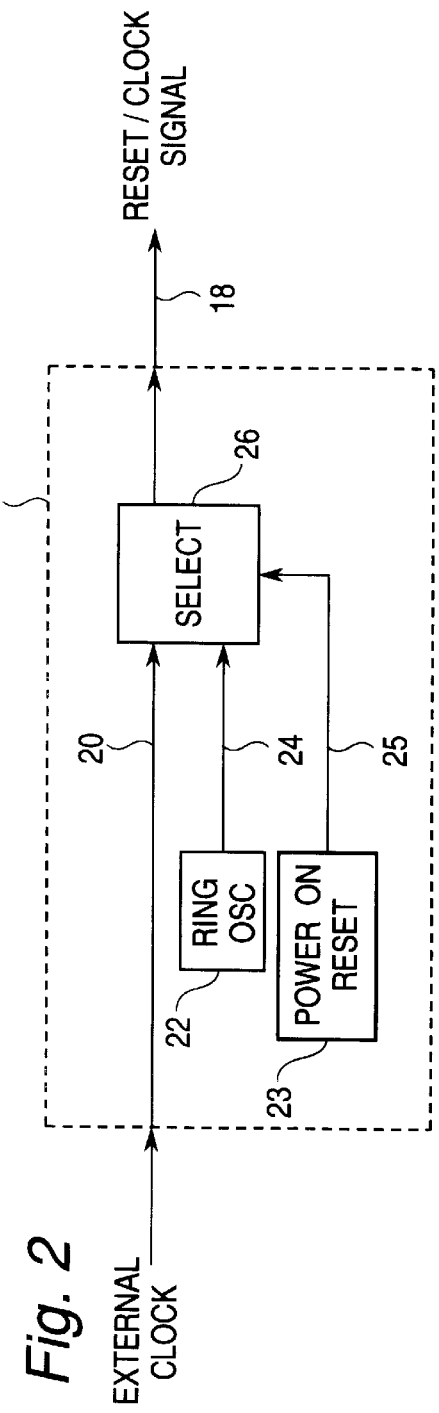
FIG. 2 is a circuit diagram of one example of a reset/clock signal generator in the embodiment of the reset circuit in accordance with the present invention.

An example of a detailed construction of this reset/clock signal generator 21 is shown in FIG. 2. In FIG. 2, Reference Numeral 22 designates a self-running oscillator such as a ring oscillator, and Reference Numeral 23 denotes a power-on-reset circuit. Reference Numeral 20 shows an external clock signal line, and Reference Numeral 26 indicates a selector for selecting either the external clock signal 20 or an internal clock 24 generated in the internal oscillator 22. This selector 26 is controlled by an output signal 25 of the power-on-reset circuit 23.

Figure 3:
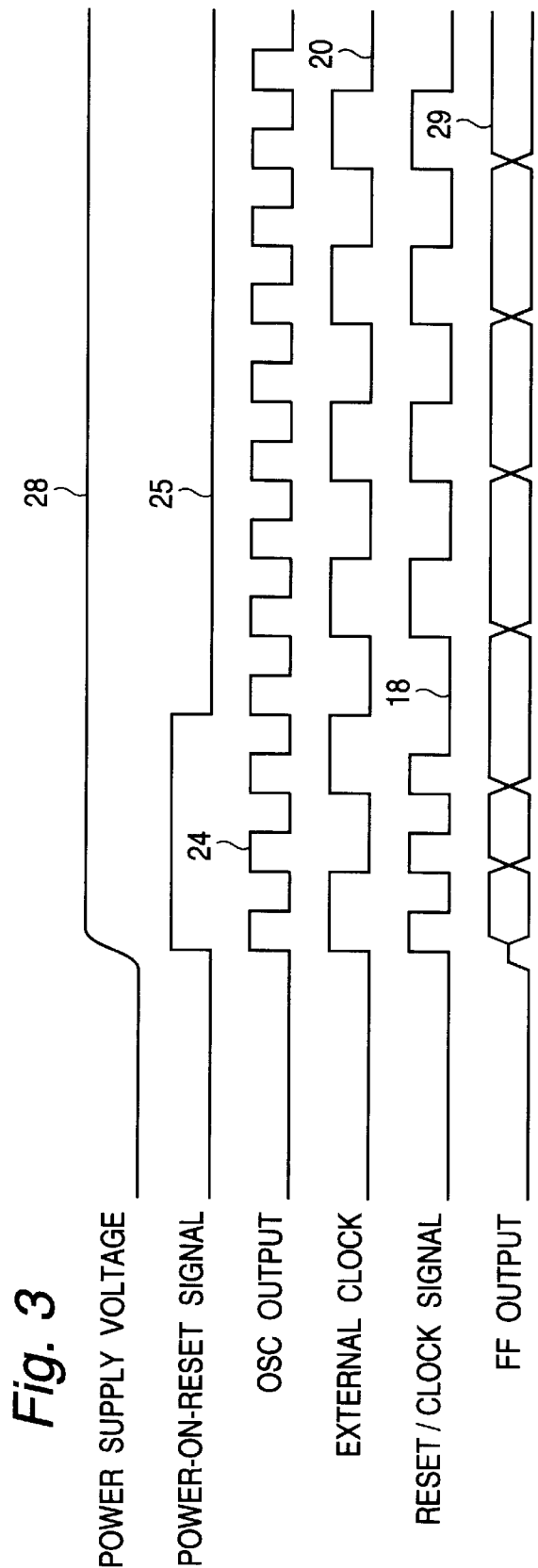
FIG. 3 is a timing chart for illustrating an operation of the reset circuit in accordance with the present invention having the reset/clock signal generator shown in FIG. 2.

Now, an operation of the embodiment of the reset circuit in accordance with the present invention will be described with reference to FIG. 3 which is a timing chart for illustrating an operation of the reset circuit in accordance with the present invention having the reset/clock signal generator shown in FIG. 2. Reference Numeral 28 indicates a change of a power supply voltage. Reference Numeral 25 designates the output of the power-on-reset circuit 23. Reference Numeral 24 denotes an output of the internal oscillator 22. Reference Numeral 20 shows the external clock signal. Reference Numeral 18 designates the reset/clock signal outputted from the selector 26. Reference Numeral 29 denotes an output of the flipflops 7 to 9. As seen from the waveform of the power supply voltage, FIG. 3 illustrates the condition just after the power-on of the power supply voltage. Just after the power-on of the power supply voltage, the power-on-reset signal 25 of a high level is outputted during a constant period of time determined by a time constant of an internal circuit of the power-on-reset circuit.

When the active power-on-reset signal 25 (of the high level) is outputted, the selector 26 is controlled to select the output 24 of the internal oscillator 23, and therefore, the output 24 of the internal oscillator 23 is outputted as the output 18 of the reset/clock signal generator 21. Since this signal 18 is supplied to the clock input terminal of the flipflops 7 to 9, the output of the flipflops 7 to 9 becomes definite immediately after the power-on of the power supply voltage.

After the power-on-reset signal 25 becomes off, namely, is deactivated to a low level, the selector 26 is controlled to select the external clock signal 20, and therefore, the external clock signal 20 is outputted as the output 18 of the reset/clock signal generator 21. Thereafter, the flipflops 7 to 9 fetch the selection signals S1, S2, . . . S(N) from the control circuit 19 in synchronism with the clock signal 18.

Thus, in the embodiment of the reset circuit in accordance with the present invention, no bus collision occurs which had occurred in the prior art because the output of the flipflops are indefinite in the prior art just after the power-on of the power supply voltage.

In the embodiment of the reset circuit in accordance with the present invention, since the clock signal input terminal also acts as the reset signal input terminal, the reset circuit can be constructed with flipflops having no reset input terminal, differently from the prior art reset circuit, and therefore, the circuit scale and the scale of the wiring for supplying the signals can be greatly reduced. On the other hand, the internal oscillator and the selector have to be added. However, if the internal oscillator is constructed of a ring oscillator, it can be constructed with a small number of gates. In addition, the selector can be constructed with a few gates at most. Accordingly, the reset circuit in accordance with the present invention has a remarkably great advantage in applications, such as microprocessor, having a large number of data path blocks connected to a bus.

Figure 4:
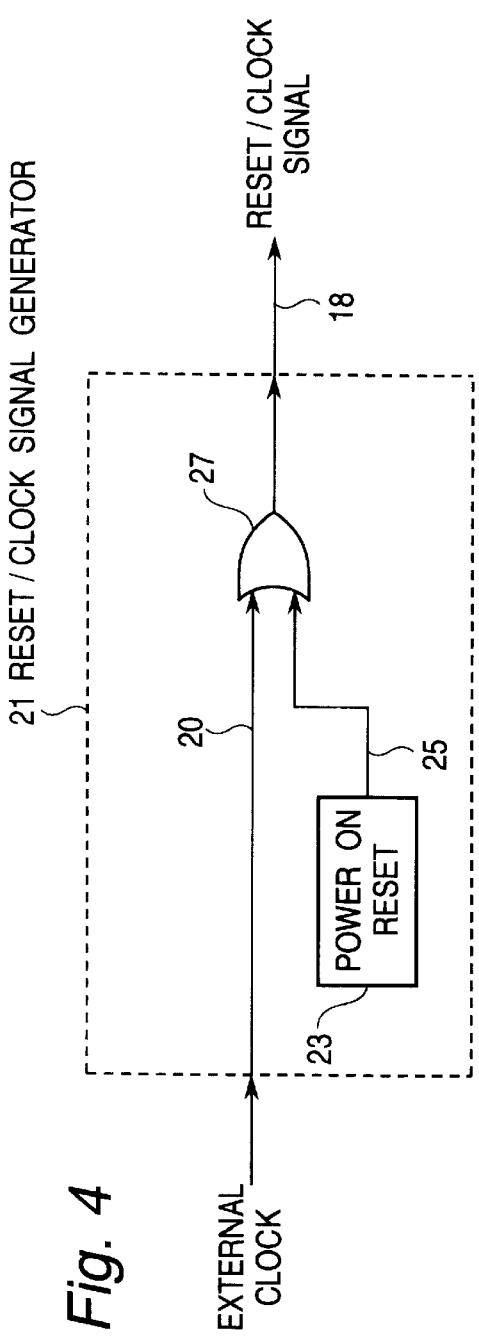
FIG. 4 is a circuit diagram of another example of a reset/clock signal generator in the embodiment of the reset circuit in accordance with the present invention.

Referring to FIG. 4, there is shown a circuit diagram of another example of the reset/clock signal generator 21 in the embodiment of the reset circuit in accordance with the present invention.

In FIG. 4, Reference Numeral 20 indicates the external clock signal 20. Reference Numeral 23 designates the power-on-reset circuit. Reference Numeral 27 denotes an OR gate. In this embodiment, the reset pulse generated in the power-on-reset circuit 23 is used as an internally generated clock.

Figure 5:
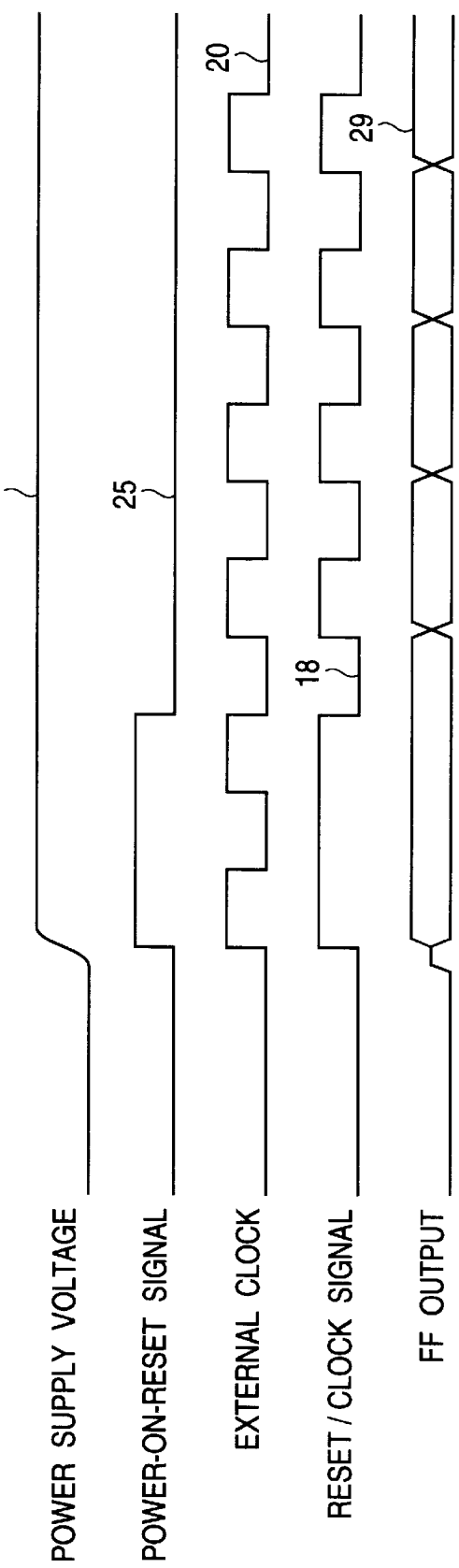
FIG. 5 is a timing chart for illustrating an operation of the reset circuit in accordance with the present invention having the reset/clock signal generator shown in FIG. 4.

An operation of the reset circuit in accordance with the present invention having the reset/clock signal generator shown in FIG. 4 will be described with reference to a timing chart of FIG. 5.

During a period in which the power-on-reset signal 25 of a high level is outputted, the reset clock signal 25 is outputted as it is through the OR gate 27 as the reset/clock signal 18. After the power-on-reset signal 25 becomes off, namely is deactivated to a low level, the external clock signal 20 is outputted as it is through the OR gate 27 as the reset/clock signal 18.

Thus, the flipflops 7 to 9 are set to a predetermined condition in response to a rising edge of the reset pulse generated by the power-on-reset circuit 23 just after the power-on of the power supply voltage. Accordingly, no bus collision occurs which had occurred in the prior art because the output of the flipflops is indefinite just after the power-on of the power supply voltage.

In this second embodiment, not only an advantage similar to that obtained in the first embodiment can be obtained, but also it is no longer necessary to provide the internal oscillator, since the reset pulse generated in the power-onreset circuit 23 is supplied a, the clock to the flipflops just after the power-on of the power supply voltage.

As mentioned above, the reset circuit in accordance with the present invention includes a clock generating means and a means for supplying a clock to the clock input terminal of the flipflops at the power-on time. Therefore, since the clock is supplied to the clock input terminal of the flipflops at the power-on time, the output of the flipflops never becomes indefinite. For example, in the case that an input/output of a plurality of tristate buffers connected to the bus are controlled by an output of a corresponding number of flipflops, it is possible to prevent generation of the pass-through current caused by an output collision on the bus, by a circuit scale which is smaller than that of the prior art reset circuit.

The invention has thus been shown and described with reference to the specific embodiments. However, it should be noted that the present invention is in no way limited to the details of the illustrated structures but changes and modifications may be made within the scope of the appended claims.

What is claimed is:

1. A reset circuit for a flipflop, said flipflop receiving an external clock to generate an output, the reset circuit comprising:

an internal clock generating circuit for generating an internal clock different from said external clock; and a clock selecting circuit receiving said external clock and said internal clock for supplying said internal clock to a clock input terminal of said flipflop at a power-on time where the output of said flipflop becomes indefinite, thereby to prevent instability of the output of the flipflop at the power-on time.

2. A reset circuit for a flipflop, claimed in claim 1, wherein said internal clock generating circuit comprises a power-on-reset circuit for generating a reset clock at the power-on time, said reset clock being supplied to said clock input terminal of said flipflop by said clock selecting circuit.

3. A reset circuit for a flipflop, claimed in claim 2, wherein said flipflop comprises a flipflop having no reset input terminal.

4. A reset circuit for a flipflop, said flipflop receiving an external clock to generate an output, the reset circuit comprising:

an internal clock generating circuit for generating an internal clock different from said external clock; and a clock selecting circuit receiving said external clock and said internal clock for supplying said internal clock to a clock input terminal of said flipflop at a power-on time where the output of said flipflop becomes indefinite, thereby to prevent instability of the output of the flipflop at the power-on time, wherein said clock selecting circuit includes a power-on-reset circuit for generating a power-on-reset signal having a predetermined active period of time at the power-on time, and a selector circuit for supplying said internal clock generated by said internal clock generating circuit, to said clock input terminal of said flipflop during a period of time in which said power-on-reset signal is active, said selector circuit supplying said external clock to said clock input terminal of said flipflop after said power-on-reset signal is rendered inactive.

5. A reset circuit for a flipflop, claimed in claim 4, wherein said internal clock generating circuit comprises a ring oscillator.

6. A reset circuit for a flipflop, claimed in claim 5, wherein said flipflop comprises a flipflop having no reset input terminal.

7. A reset circuit for a flipflop, claimed in claim 4, wherein said flipflop comprises a flipflop having no reset input terminal.

8. A reset circuit for a flipflop, claimed in claim 1, wherein said internal clock generating circuit comprises a ring oscillator.

9. A reset circuit for a flipflop, claimed in claim 8, wherein said flipflop comprises a flipflop having no reset input terminal.

10. A reset circuit for a flipflop, claimed in claim 2 said flipflop receiving an external clock to generate an output, the reset circuit comprising:

an internal clock generating circuit for generating an internal clock different from said external clock; and a clock selecting circuit receiving said external clock and said internal clock for supplying said internal clock to a clock input terminal of said flipflop at a power-on time where the output of said flipflop becomes indefinite, thereby to prevent instability of the output of the flipflop at the power-on time, wherein said internal clock generating circuit comprises a power-on-reset circuit for generating a reset clock at the power-on time, said reset clock being supplied to said clock input terminal of said flipflop by said clock selecting circuit, wherein said power-on-reset circuit generates said power-on-reset signal having a predetermined active period of time at the power-on time, and said clock selecting circuit includes an OR gate receiving said power-on-reset signal and said external clock for supplying said power-on-reset signal to said clock input terminal of said flipflop during a period of time in which said power-on-reset signal is activated at a high level, and for supplying said external clock to said clock input terminal of said flipflop after said power-on-reset signal is deactivated to a low level.

11. A reset circuit for a flipflop, claimed in claim 10, wherein said flipflop comprises a flipflop having no reset input terminal.

12. A reset circuit for a flipflop, claimed in claim 1, wherein said flipflop comprises a flipflop having no reset input terminal.

* * * * *